United States Patent [19]

Beratan

[11] Patent Number: 5,695,384
[45] Date of Patent: Dec. 9, 1997

[54] CHEMICAL-MECHANICAL POLISHING SALT SLURRY

[75] Inventor: Howard R. Beratan, Richardson, Tex.

[73] Assignee: Texas Instruments Incorporated, Dallas, Tex.

[21] Appl. No.: 350,561

[22] Filed: Dec. 7, 1994

[51] Int. Cl.[6] .................... B24B 1/00; B24B 7/19; B24B 7/30
[52] U.S. Cl. .................................. 451/28; 451/41
[58] Field of Search .................... 451/28, 41, 36, 451/37; 437/225, 645, 228, 156, 636; 156/636.1; 216/88, 89; 106/3

[56] References Cited

U.S. PATENT DOCUMENTS

| | | | |
|---|---|---|---|
| 4,256,535 | 3/1981 | Banks | 451/28 |
| 4,435,247 | 3/1984 | Basi et al. | 216/89 |
| 5,069,002 | 12/1991 | Sandhu et al. | 451/41 |
| 5,209,816 | 5/1993 | Yu et al. | 156/636.1 |
| 5,232,875 | 8/1993 | Tuttle et al. | 437/225 |
| 5,287,213 | 2/1994 | Zhuang et al. | 359/244 |
| 5,318,927 | 6/1994 | Sandhu et al. | 437/228 |
| 5,340,370 | 8/1994 | Cadien et al. | 216/89 |
| 5,391,258 | 2/1995 | Brancaleoni et al. | 216/89 |
| 5,433,650 | 7/1995 | Winebarger | 457/41 |

FOREIGN PATENT DOCUMENTS 361049425  3/1986  Japan ........................... 216/89

OTHER PUBLICATIONS

Peroxide Polishing of Semiconductor Wafers to Sub-nm Finish, Department of Chemistry, University of Glasgow, Logitech Ltd. Ershine Ferry Road, Old Kilpatrick, Glasgow G60 5 EU, Scotland, UK.

*Primary Examiner*—James G. Smith
*Assistant Examiner*—Derris H. Banks
*Attorney, Agent, or Firm*—James E. Harris; James C. Kesterson; Richard L. Donaldson

[57] ABSTRACT

An improved slurry composition and method of polishing a workpiece are disclosed. This composition allows use of a neutral pH slurry for chemical-mechanical polishing many surfaces. One disclosed composition comprises 85% water, 4% NaCl, 4% $H_2O_2$, and 7% colloidal silica. It has been found that such a slurry produces a high material removal rate for barium strontium titanate (BST) polishing, without damage to the surface of the BST workpiece commonly found with other slurry compositions. This slurry has been found to also polish diamond, silicon carbide, gallium arsenide, and many other difficult-to-polish materials.

15 Claims, 1 Drawing Sheet

CHEMICAL-MECHANICAL POLISHING SALT SLURRY

FIELD OF THE INVENTION

This invention relates generally to chemical-mechanical polishing (CMP), such as for semiconductor wafers, and more specifically to a polishing solution for use in CMP.

BACKGROUND OF THE INVENTION

In certain manufacturing operations it is often required that at least one surface of a workpiece (e.g. a substrate, blank of solid material, or multiphase body having two or more materials arranged in regions of a surface) be polished to a precise profile, e.g. uniformly flat, with low surface roughness. Such operations arise in the fabrication of optical components, blank and patterned semiconductor devices, and ceramics, for example. Numerous methods exist which employ mechanical means with abrasives, chemical action, electropolishing, and combinations of these to effect polishing. Desirable features for typical polishing operations include low polish induced damage, high polishing rate, process predictability, high polished surface uniformity, low polished- surface roughness, and the use of non-hazardous, low-cost polish materials. Satisfactory polishing of hard materials, particularly under these constraints, is difficult to achieve.

Chemical-mechanical polishing methods and polishing slurries are well known and widely used. Virtually all prior art polishing slurries for use in CMP contain fine, suspended abrasive particles (for mechanical polishing) and highly acidic or basic (i.e. low or high pH) chemical components (for chemical polishing). The average size of the abrasive particles generally affects the polish rate and quality, with larger particles polishing faster but leaving more surface damage. Chemical component selection may also dramatically affect polish rate and quality. Some low or high pH chemical solutions, for example, react unfavorably with polycrystalline workpieces, causing preferential etching of the workpiece surface along grain boundaries, as well as non-uniform attack of the grains themselves, both of which may increase surface roughness. These solutions may also be hazardous to human operators, require special materials for the polishing machines to avoid corrosion, and after what is usually a one-time use, become hazardous waste products.

SUMMARY OF THE INVENTION

The present invention relates to CMP polishing slurries which overcome many of the problems and disadvantages of the prior art polishing slurries. In accordance with the present invention, a slurry composition for use in chemical-mechanical polishing is provided. This composition is comprised of: a carrier solution comprising hydrogen peroxide and water; colloidal particles disposed in the carrier solution; and at least one salt dissolved in the carrier solution and comprising at least 0.1 weight percent (preferably at least 2 weight percent) of the slurry composition. The carrier solution may also comprise other liquids, such as ethylene glycol, propylene glycol, alcohols, and combinations of these. The colloidal particles preferably comprise colloidal silica or alumina particles with average size between 50 nm and 3 µm. The salt is preferably a halide salt (and more preferably sodium chloride).

The present invention also describes an improved method for polishing surfaces such as BST surfaces on a workpiece. This method comprises interposing a slurry supply between a polishing surface (preferably a polishing pad) and a polish surface (e.g. a BST surface) and providing both a relative motion of the polishing surface across the polish surface and a force to hold the two surfaces in contact. The slurry supply comprises water, hydrogen peroxide, colloidal particles, and at least 0.1 weight percent of a salt.

Although the underlying reactions are not yet well understood, it has been found that the addition of, e.g., a soluble halide salt, to an aqueous slurry of colloidal silica, may improve both the polishing rate and the surface finish achievable with such a slurry, while maintaining the chemical pH near neutral (pH=7). Alternately, the pH of the slurry may be adjusted in a wide range to, for example, control leaching or handle other workpiece-specific goals. This slurry may be applicable to the polishing of workpieces made from a wide variety of materials, such as barium strontium titanate (BST), a ceramic material. BST in particular may be used in building dynamic random access memory (DRAM), non-volatile memory, infrared detectors, and other devices which, e.g., exploit BST's high dielectric constant and extraordinary ferroelectric and pyroelectric effects. Examples of other applicable workpiece materials include gallium arsenide (GaAs), diamond, silicon carbide, as well as other perovskite materials and high critical temperature superconductors.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

Figure 1:
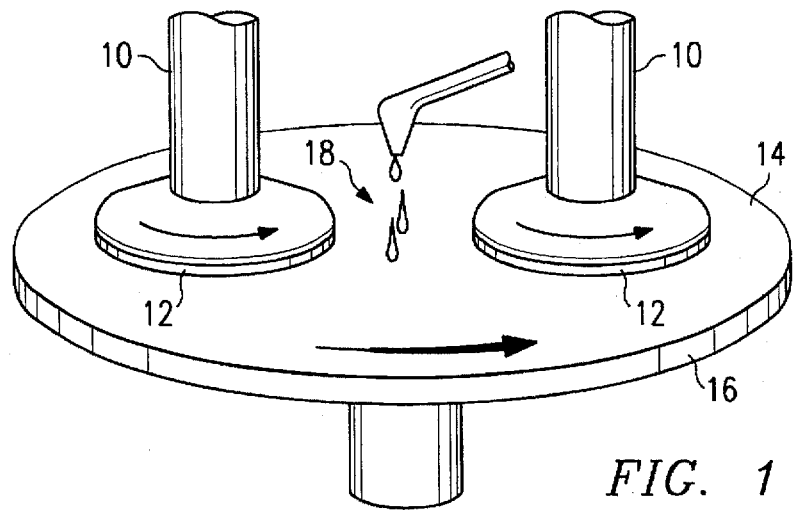
FIG. 1 shows a simplified arrangement for a generic polishing machine.

FIG. 1 shows an arrangement of pertinent pieces of a generic two head polishing machine, for illustration purposes. Single or multiple workpieces 12, e.g. wafers, are mounted on holders 10, which are typically rotatable. A polishing pad 14 (i.e. a polishing surface) is typically mounted on a rotatable platen 16. The polishing surface is continually resupplied with slurry 18, which flows across the surface of and off the perimeter of 14. Polishing pad 14 containing slurry 18 is held in physical contact with, and coplanar to, a surface to be polished on workpiece 12. Relative motion between pad 14 and workpiece 12, usually supplied by the rotation of holder 10 and/or platen 16, ensures that a fresh supply of slurry is continuously interposed between pad and workpiece.

In one preferred embodiment, substrates of BST may be polished in such an arrangement. BST may be used to detect infrared energy, and as such finds use as a key component of uncooled infrared detectors and detector arrays. Before a detector array may be fabricated on a blank BST wafer, the wafer is typically polished to give a smooth, planar surface, since the mechanical and electrical properties of the BST are both important to detector performance. However, BST used in such an application is polycrystalline, and experiences preferential etching of grain boundaries and of grains in certain grain orientations when low pH slurries are used in polishing. Also, barium may be leached from the BST crystals by such slurries, destroying the beneficial electrical properties of the material.

Figure 2:
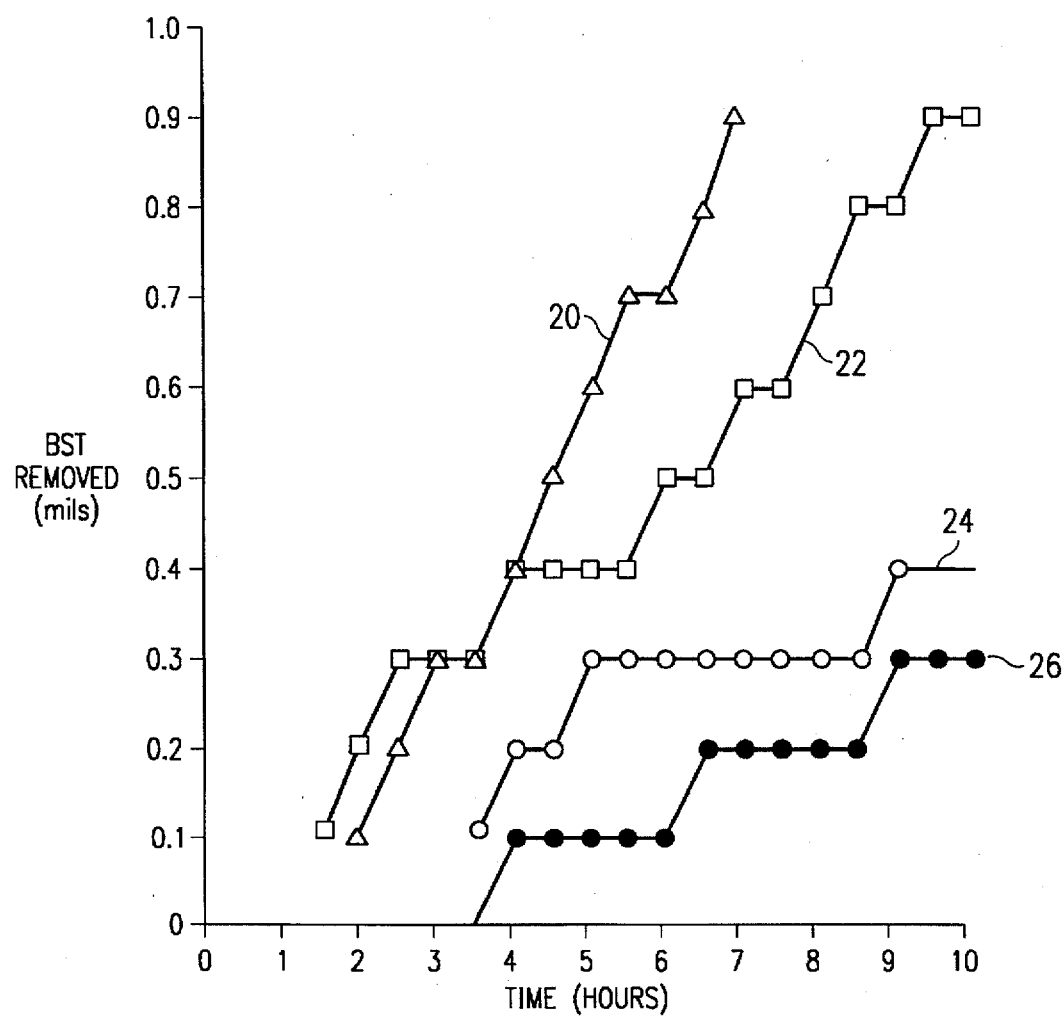
FIG. 2 is a graphical comparison of BST polishing rates achieved for four polishing slurry compositions.

FIG. 2 is a comparison of the BST material removed from a BST wafer, as a function of polish time, for four different polish solutions 18. The ordinate is calibrated in increments of 0.0001 inch (0.1 mils) of BST removed (the accuracy of the measuring device) and the abscissa in increments of half-hour polishing times. The polishing slurry giving the fastest removal rate (labeled as plot 20) contains 0.3 micron (μm) alumina grit in water (providing mechanical polishing only). Despite the high removal rate, results for 20 are considered poor because the BST surface is left damaged and rough, thus requiring an extensive fine polishing before use in detector applications. To improve the surface quality, 0.05 μm alumina grit and water slurry may be used, as shown in plot 26. Although 26 shows the expected reduced polishing rate due to the finer particles, BST surface damage is still present after polishing.

The rate represented by 24 was achieved by a previously preferred slurry for fabricating the referenced IR sensors. In this case, the slurry consists of Nalco 2360 (a 40% or greater suspension of colloidal silica in water), water, and a 5.25% aqueous solution of sodium hypochlorite (i.e. laundry bleach).

In accordance with the present invention, a slurry composition for use in chemical-mechanical polishing is provided. This composition is comprised of: a carrier solution comprising hydrogen peroxide and water; colloidal particles disposed in the carrier solution; and at least one salt dissolved in the carrier solution and comprising at least 0.1 weight percent (preferably at least 2 weight percent) of the slurry composition. The carrier solution may also comprise other liquids, such as ethylene glycol, propylene glycol, alcohols, and combinations of these. The colloidal particles preferably comprise colloidal silica or alumina particles with average size between 50 nm and 3 μm. The salt is preferably a halide salt (and more preferably sodium chloride).

The removal rate of a slurry formed according to the present invention is shown in FIG. 2 as plot 22. It can be seen to approach the rate of the harsher slurry composition 20, but the final surface finish exhibits no noticeable preferential etching or damage and needs no further polishing. Example slurry composition 22 has a neutral pH, and comprises 85% water, 4% salt (NaCl), 4% hydrogen peroxide (i.e. from a 30% dilute aqueous solution), and 7% colloidal silica (all values in weight percent). It has been observed that percent concentrations may be varied over large ranges without severe detrimental effects. However, further tests (not shown in FIG. 2) using a slurry composition comprising water, $H_2O_2$, and NaCl, but without colloidal silica, did not polish BST measurably.

As mentioned previously, the physics and chemistry related to this polish composition are not well understood. It is known that colloids have electrical surface charges that both influence their ability to remain suspended in solution and keep the colloidal particles from clustering. One possible explanation of the observed polish results is that these colloid charges are influenced by the NaCl salt ions in such a manner as to continuously expose a clean surface to the polishing compound, thereby achieving the results shown in FIG. 2, plot 22. The colloids probably also supply a mechanical component to the overall polish without inducing mechanical damage.

While this invention has been described with reference to illustrative embodiments, this description is not intended to be construed in a limiting sense. For example, although emphasis has been placed on the neutral pH, chemical activity ranging from pH=1.5 to pH=11 (preferably between 6 and 8) may be useful in some applications. The slurry may also contain a passivant such as fluorine provided by HF, which forms a passivation layer on some polish surfaces. The salt content of a slurry formed according to the invention is preferably at least 0.1% by weight. NaCl is the salt used in the described preferred embodiments, but any water soluble salt of the chloride, fluoride, iodide or bromide family of halide salts may be substituted (such as NaF, NaB, KCl, $NH_4Cl$, or combinations of such salts). Compounds of halides with sodium, potassium, iron and ammonia, as well as other metals, may be suitable. Colloidal silica is specified in some preferred embodiments; colloidal alumina is one alternative in the polish composition. Average colloid particle sizes preferably range from 0.05 to 3 μm. Although aqueous solutions are emphasized, other carrier solutions such as alcohol, ethylene glycol, and propylene glycol may be used in a slurry composition.

In the fabrication of semiconductor devices of the silicon (Si) or gallium-arsenide (GaAs) family, in addition to blank substrate or bulk polishing, it is sometimes desirable to polish the partially fabricated devices during manufacture. Some of these applications involve the use of (1) magnetic films for non-volatile memories, (2) very high dielectric constant materials to achieve smaller dimensions for semiconductor memories, (3) multiple planar layers of active semiconductor devices, and (4) surface acoustic wave devices. This invention can be used to advantage in such applications because of its neutral pH, speed of polish, and achieved surface quality.

Diamond films and silicon carbide films are frequently required for their superior thermal properties and wear resistance. Further polishing is normally required after their growth or deposition. These materials are very difficult to polish but this invention may be used to achieve superior polishing results for these materials.

There are numerous alternate materials for devices requiring piezoelectric and/or pyroelectric properties. A few are lead zirconate titanate, lead lanthanum zirconate titanate, (PbSr)$TiO_3$, Pb($SC_{x/2}Ta_{x/2}$)$O_3$, $Bi_4Ti_3O_{12}$, strontium barium niobate, (Pb,Ba)$Bi_4Ti_4O_{15}$, lead magnesium niobate, $LiNbO_3$, $LiTaO_3$ and Pb(Zn,Nb)$O_3$. All of these materials may be polished using the present invention.

Various modifications and combinations of the illustrative embodiments, as well as other embodiments of the invention, will be apparent to persons skilled in the art upon reference to the description. It is therefore intended that the appended claims encompass any such modifications or embodiments. For example, the particular arrangement of a polishing machine may vary, so long as a slurry supply and a polishing surface are used in polishing.

What is claimed is:

1. A slurry composition for use in chemical-mechanical polishing, said composition comprising:
   (a) a carrier solution comprising hydrogen peroxide and water;
   (b) colloidal particles disposed in said carrier solution; and
   (c) at least one salt dissolved in said carrier solution and comprising at least 0.1 percent by weight of said slurry composition.

2. The composition of claim 1, wherein said salt is a halide salt.

3. The composition of claim 1, wherein said salt is selected from the group consisting of NaCl, NaF, NaB, KCl, $NH_4Cl$, and combinations thereof.

4. The composition of claim 1, wherein said slurry composition has a pH between 6 and 8.

5. The composition of claim 1, wherein said carrier solution further comprises a material selected from the group consisting of ethylene glycol, propylene glycol, alcohols, and combinations thereof.

6. The composition of claim 1, wherein said colloidal particles comprise colloidal silica.

7. The composition of claim 1, wherein said colloidal particles comprise colloidal alumina.

8. The composition of claim 1, wherein said colloidal particles have an average size of between 10 nm and 0.1 µm.

9. A slurry composition for use in chemical-mechanical polishing of a barium strontium titanate (BST) surface, said composition comprising:

(a) a carrier solution comprising hydrogen peroxide and water;

(b) colloidal particles disposed in said carrier solution; and (c) at least one salt dissolved in said carrier solution and comprising at least 0.1 weight percent of said slurry composition;

said slurry composition having a pH between 1.5 and 11.

10. The composition of claim 9, wherein said salt is a halide salt.

11. The composition of claim 9, wherein said salt is selected from the group consisting of NaCl, NaF, NaB, KCl, $NH_4Cl$, and combinations thereof.

12. The composition of claim 9, wherein said carrier solution further comprises a material selected from the group consisting of ethylene glycol, propylene glycol, alcohols, and combinations thereof.

13. The composition of claim 9, wherein said colloidal particles comprise colloidal silica.

14. The composition of claim 9, wherein said colloidal particles comprise colloidal alumina.

15. The composition of claim 9, wherein said colloidal particles have an average size of between 10 nm and 0.1 µm.

\* \* \* \* \*